United States Patent [19]

Smolley

[11] Patent Number: 4,581,679
[45] Date of Patent: Apr. 8, 1986

[54] MULTI-ELEMENT CIRCUIT CONSTRUCTION

[75] Inventor: Robert Smolley, Porteughese Bend, Calif.

[73] Assignee: TRW Inc., Redondo Beach, Calif.

[21] Appl. No.: 737,631

[22] Filed: May 24, 1985

Related U.S. Application Data

[62] Division of Ser. No. 499,136, May 31, 1983.

[51] Int. Cl.$^4$ ............................................. H05K 1/14
[52] U.S. Cl. .................................... 361/395; 361/393; 361/413; 361/414; 339/17 M
[58] Field of Search ............... 361/392, 393, 394, 395, 361/412, 413, 414; 339/17 LM, 17 M

[56] References Cited

U.S. PATENT DOCUMENTS

| | | | |
|---|---|---|---|
| 3,200,297 | 8/1965 | Gibson | 361/412 |
| 3,795,037 | 3/1974 | Luttmer | 174/52 FP X |
| 3,904,934 | 9/1975 | Martin | 361/412 |
| 3,967,162 | 6/1976 | Ceresa et al. | 339/17 M X |
| 4,029,375 | 6/1977 | Gabrielian | 339/17 M |

OTHER PUBLICATIONS

E. D. Barkhuff, Connector, IBM Tech. Disc. Bull., V. 22 #1, Jun. 1979 pp. 158 & 159.

*Primary Examiner*—R. R. Kucia
*Attorney, Agent, or Firm*—Noel F. Heal; Robert M. Wallace

[57] ABSTRACT

A packaging construction for electronic circuit package elements, such as printed circuit boards and integrated-circuit chip packages, to obviate the need for connector cables, back-panel wiring and similar techniques. Circuit packaging elements are interconnected through an interconnection medium that includes an insulated board with opening through it, and a number of connector elements in the form of compressible wads of conductive wire. The connector elements are disposed in selected openings in the insulated board and compressed into contact with contact areas formed on the circuit package elements. Shorter lead lengths and improved circuit operating speed are the principal results of the approach. In a three-dimensional construction employing the principles of the invention, chip packages are arranged in modules, and interconnections may be made between chip packages within each module, tranversely between modules, and in a third direction between layers of modules. The construction provides direct interconnections without the use of solder, connector cables or multilayer circuit boards, and makes most effective use of high-speed integrated circuitry.

6 Claims, 6 Drawing Figures

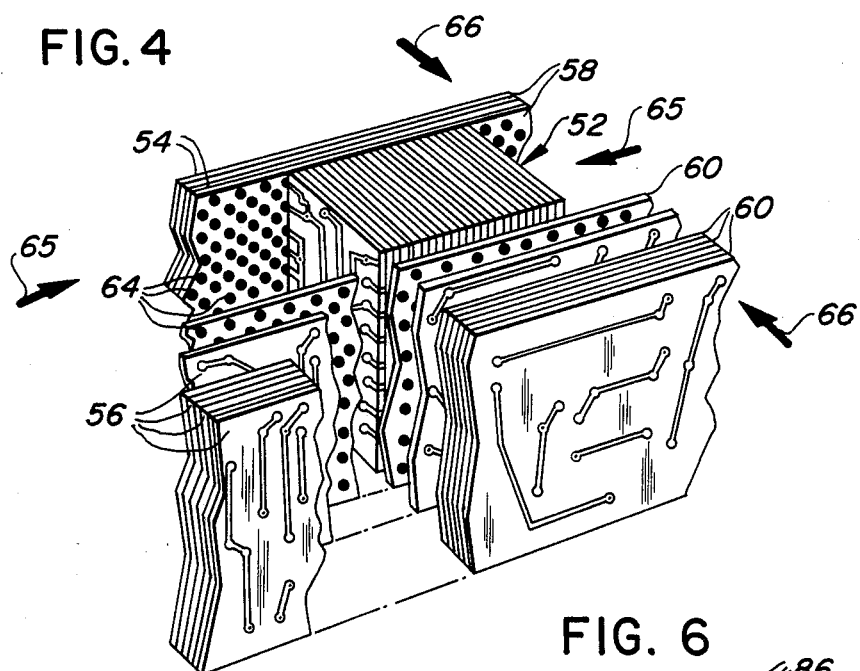
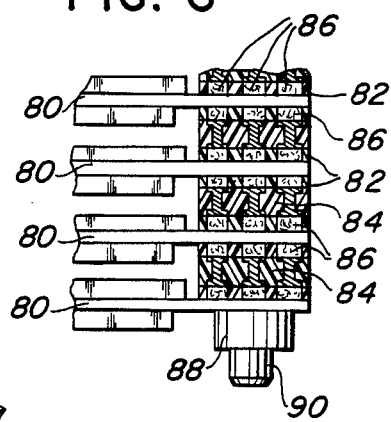
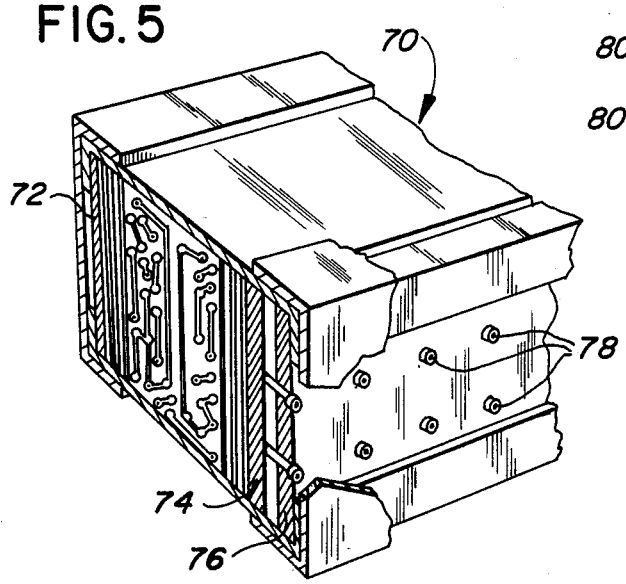

MULTI-ELEMENT CIRCUIT CONSTRUCTION

This is a division of application Ser. No. 499,136 filed May 31, 1983.

BACKGROUND OF THE INVENTION

This invention relates generally to techniques for the packaging of multiple circuit elements, and more particularly to structures for the interconnection of multiple circuit elements, such as circuit boards and integrated-circuit (IC) ("chip") packages. Complex circuitry is often implemented in the form of a number of multilayer printed circuit boards, which must be appropriately interconnected to permit the circuitry to perform its intended function.

In the past, circuit boards in very large scale integration (VLSI) systems have been interconnected by means of "mother" boards having connectors into which the other circuit boards are plugged. An alternative approach uses cable harnesses and connectors to attach to the boards. The use of either mother boards or cable harnesses adds considerably to the cost of the finished product, and has another important consequence. For high-speed circuits in VLSI systems, a major concern is that interconnecting cables contribute a large amount of capacitance and inductance, and thereby limit the speed of operation of the circuitry. Insulation material that has to be used in the cable harness further increases interconnection reactances and aggravates this problem. Moreover, the use of cable harnesses can add as much as twenty-five percent to the volume of the entire assembly, and can add accordingly to the assembly weight.

Another significant problem arising from the use of cables and mother boards is that all input and output leads in each board must be terminated at an edge of the board, for attachment to a back-plane connector. A signal originating at an area of the board remote from the edge connector must weave its way through other conductors and components on the board. This necessitates long lead lengths and complicates the board design, often requiring additional board layers and a higher density of wiring.

In accordance with conventional packaging techniques, integrated-circuit chips are interconnected by means of multilayer printed circuit boards. The boards are, in turn, interconnected by a variety of "back-panel" wiring techniques using wire-wrap terminals, soldered terminals, and plug-in connectors.

Planar multilayer printed circuit boards include such materials as epoxy glass, Polymide, or ceramic materials, like aluminum oxide ($Al_2O_3$). All of these materials have relatively high dielectric constants and present serious problems to the highspeed circuit designer. The distributed capacitance of the necessary interconnections in a high speed system using multilayer circuit boards may be so high as to demand a charging current that is a significant factor contributing to the total power dissipated in the circuitry. A related problem is that the distributed capacitance of the interconnections effectively limits their length if the capacitance values are to be kept within reasonable limits. For typical high speed systems, the associated printed circuit boards may have geometric features with widths of approximately 0.07 inches and spacings of the same dimension. For these parameters the associated distributed capacitance limits the maximum lead length to about 10 to 15 inches.

The reactances resulting from the use of conventional interconnection technology result in an even more important problem. High signal propagation times resulting from the interconnection reactances may render high speed system completely inoperative, or at best extremely limited in operating speed and data throughput.

The problems described with respect to high speed circuits have become aggravated in recent years as the complexity of the circuitry has increased. Also the chip packages themselves require very large numbers of leads for input and output of signals. Existing high speed circuit designs require up to two hundred input-output leads, and future designs could easily extend this requirement to around five hundred leads. To accommodate a modest chip package having 132 leads requires a circuit board with over sixteen layers. Moreover, some manufacturers are already using boards with up to thirty-three layers. Circuit boards of this complexity require considerable time to design and produce. A design change of even the simplest nature can result in scrapping of the associated circuit boards, at further cost to the manufacturer.

To obviate or minimize these problems that arise from the use of conventional interconnection techniques, it has become apparent that a new packaging approach must be employed. The new approach should minimize the lead lengths between interconnected circuits, and provide a correspondingly high packing density that makes more effective use of modern integrated-circuit fabrication techniques. The present invention is directed to these ends.

SUMMARY OF THE INVENTION

The present invention resides in a novel circuit packaging construction, in which multiple circuit elements, such as printed circuit boards and integrated-circuit chip packages, are electrically interconnected at their faces or edges, as is most convenient, to minimize interconnection lead lengths both between and within the circuit elements.

In one embodiment of the invention, for use with high speed circuits, a three-dimensional packaging construction is employed. At least some of the circuit elements in this construction are IC chip packages, each comprising a circuit chip mounted on a flat packaging board having contact areas on its faces and edges. Leads from the chip to the contact areas are not limited to a particular face or edge of the packaging board. The chip packages are arranged in chip modules, each with a plurality of chip packages having their faces parallel to a first planar direction. Between each pair of adjacent chip packages is at least one two-sided printed circuit board, having contact areas on each face for contacting the chip packages, and having conductive paths from one side of the board to the other, formed either through or around the edges of the board. Electrical contacts between the chip packages and the two-sided circuit boards is established by means of connector elements supported by insulating boards.

Adjacent chip modules are interconnected between adjacent side edges by transverse interconnection means, comprising connector elements, insulating boards, and two-sided circuit boards, to establish connections between selected side-edge contact areas of one chip module and selected side-edge contact areas of an adjacent chip module. This transverse interconnection means has its connecting circuit boards and insulating boards parallel to a second planar direction at right-angles to the first. In a similar fashion, top and bottom edges of each chip module are interconnected with adjacent chip modules by intermodule connection means arranged in a planar direction at right-angles to the other two. This intermodule connection means extends across the edges of all chip modules in a layer of chip modules, as well as across the edges of the transverse interconnection means, thus permitting interconnection between all chip modules in the layers above and below the intermodule connection means.

In another embodiment of the invention, the circuit elements are multilayer printed circuit boards on which are mounted a variety of electrical components, some of which have substantial thickness. In this embodiment, the invention includes between each pair of adjacent boards two insulated boards for supporting and locating equal pluralities of connector elements, and a feed-through spacer panel interposed between the two insulated boards. The spacer panel has contact areas corresponding in location to the contact areas on the circuit boards to be interconnected. Electrical connections are therefore established between the circuit boards through the feed-through spacer panel. The spacer panel is of sufficient thickness to provide clearance for the components disposed between the two circuit boards. There may be a number of such circuit boards arranged in parallel and clamped together to make the electrical connections through the connector elements and feed-through spacer panels between each pair of adjacent boards.

In each of the embodiments described, the connector elements are preferably each formed as a single strand of wadded wire that makes electrical contact at multiple points when compressed against a contact area. Connectors of this type have significant advantages over soldered or wire-wrapped connections, and provide connections of high integrity and reliability. In contrast to a soldered connection, this mechanical connector element has very few associated variables that can affect the quality of the connection. In fact the only significant variables are the size of the element, which can be fairly accurately controlled, and the compressive force used to make the connection, which is also easily controllable.

In the illustrative embodiment of the threedimensional packaging construction, one edge of each chip package is in contact with a heat sink, leaving two faces and three edges for interconnection contact areas. Thus, only two layers of chip modules are used, one in contact with a heat sink at the bottom of the assembly and the other in contact with a heat sink at the top of the assembly. It will be understood, however, that in particular designs it may be possible to include more than two layers of chip modules in a single integrated package.

Use of this three-dimensional packaging construction allows chip packages to be located at minimum distances from each other, thus minimizing lead inductance and capacitance. A related advantage is that lead "fan out" problems in the chip packages are reduced substantially, since input and output leads can be brought out to any of five faces of the package. Since no solder is used in asembling the package, the connections are extremely reliable and design modifications are easy to implement. The chip packages can be reused or even moved to other assemblies in the event of a design change.

Another advantage is that, since no multilayer circuit boards are needed, the two-sided boards used can be of materials with lower dielectric constants, further reducing the capacitance of the interconnection circuitry. For conventional designs, these materials are usually rejected as unsuitable for use in multilayer boards because of poor temperature, solderability or lamination performance.

It will be appreciated from the foregoing that the present invention represents a significant advance in the field of packaging of electronic components. Other aspects and advantages of the present invention will become apparent from the following more detailed description, taken in conjunction with the accompanying drawings.

BRIEF DESCRIPTION OF THE DRAWINGS

FIG. 4 is an exploded perspective view showing a plurality of circuit boards interconnected by face contacts and by edge contacts;

FIG. 5 is a simplified view showing one method of applying compression force to the assembled circuit boards of FIG. 5 in one axial direction; and FIG. 6 is a sectional view of another embodiment of the invention, used to interconnect circuit boards having mounted components of substantial thickness.

DESCRIPTION OF THE PREFERRED EMBODIMENTS

Figure 1:
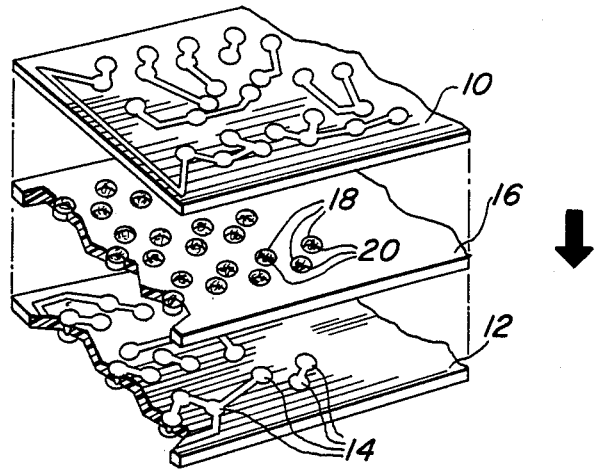
FIG. 1 is a fragmentary, exploded perspective view showing the interconnection of two circuit boards using the technique of the invention.
Figure 2:
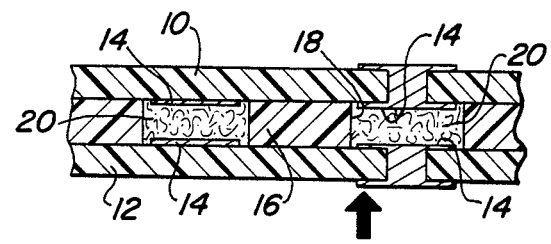
FIG. 2 is an enlarged and fragmentary sectional view showing two circuit boards interconnected using the technique of the invention.

FIGS. 1 and 2 illustrate an example of the type of connection employed in the invention illustrated in FIGS. 3-6. FIGS. 1 and 2, depict two twosided printed circuit boards, indicated generally by reference numerals 10 and 12, between which selected electrical connections are to be made. Rather than having each desired connection point connected to an edge of the board, where a connector plug might be attached, the connection points are instead formed as contact areas or pads 14 at more convenient locations on the boards 10 and 12. Interposed between the circuit boards 10 and 12 is an insulated board 16 referred to as a button board. The button board has a plurality of circular openings 18 formed through it, and in each selected opening is placed a connector element 20. The connector elements 20 are formed from single strand of metal wire, each strand being wadded together to form a nearly cylindrical "button" of material. When one of the button elements 20 is placed in one of the holes 18, the button material projects slightly out of the hole at both ends. When a compressive force is applied to the assembly comrising the two circuit boards 10 and 12, the insulating board 16 and the connector buttons 20, the latter are compressed against the contact areas 14, and an extremely reliable electrical contact is formed.

In contrast to a soldered connection, this mechanical connector element has very few associated variables that can affect the equality of the connection. In fact the only significant variables are the size of the element, which can be fairly accurately controlled, and the compressive force used to make the connection, which is also easily controllable. The wadded wire elements 20 may be fabricated as required for particular applications. In the embodiments described, the button connector elements 20 are manufactured by Technical Wire Products, Inc. of Piscataway, N.J., under the trademark Fuzz Button.

The buttons 20 as employed in these illustrative embodiments are fabricated using 0.002 inch beryllium copper wire, which is gold plated and wadded into a nearly cylindrical button of 0.042 inch diameter and length. The button under compression makes multiple contacts with a contact pad, and provides multiple conductive paths through the structure. In addition, each contact made by the button is at a very high pressure, because of the type of spring formed by the wadded wire and the small area of each contact point.

Figure 3:
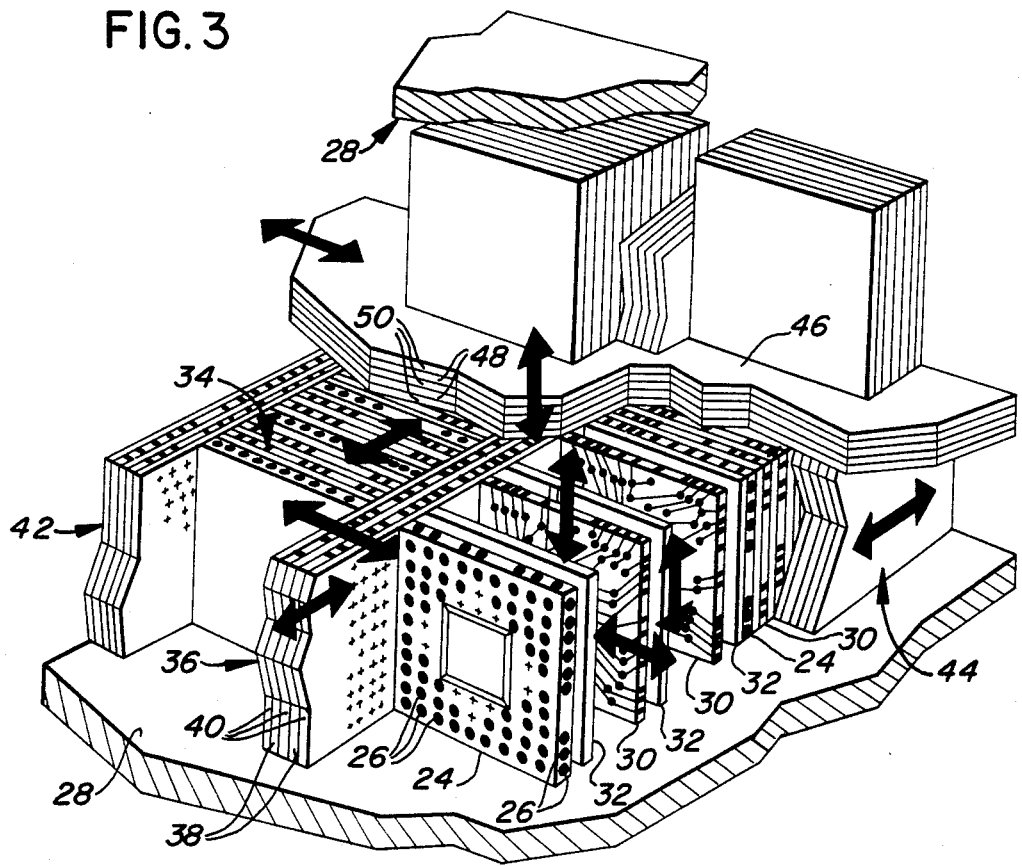
FIG. 3 is a fragmentary perspective view of a three-dimensional construction employing the principles of the invention, with portions broken away for clarity.

FIG. 3 illustrates the three-dimensional packaging structure of the invention. In the illustrated construction, a plurality of chip packages 24 are disposed in a parallel relationship and interconnected in various ways to be described. Each of the chip packages has contact areas 26 to which input and output leads to and from the chip are connected. The contact areas 26 may be on either face of the chip package, or on as many as three of its edges. The fourth edge, not visible in the view of FIG. 3, is used for making contact with a heat sink 28. Between each adjacent pair of chip packages 24 are two two-sided circuit boards 30, which serve to make connections between the chip packages, and with edge contact areas on the circuit boards. Connections between chip packages and circuit boards and between adjacent circuit boards are made using button boards 32 and connector buttons like the buttons 20 discussed with reference to FIGS. 1 and 2.

The chip packages 24, circuit boards 30, button boards 32 and connector buttons together comprise one chip module. Another chip module is indicated generally by reference numeral 34, and it will be noted that this module is connected to the first one by a tranverse module interconnect 36. The transverse module interconnect 36 comprises two additional twosided circuit boards 38 and three spacer boards 40 with appropriately positioned connector buttons (not shown in FIG. 3). The boards 38 and button boards 40 forming the transverse interconnect 36 are of the same height as the chip packages and interconnects in each chip module. Further transverse interconnects are shown at 42 and 44. An array of chip modules and transverse interconnects is referred to herein as a chip module layer.

Completing the three-dimensional construction is an intermodule interconnect 46, which extends over the entire chip module layer described above. The intermodule interconnect 46 also includes two two-sided circuit boards 48 and button boards 50. Through this interconnect, connections are established both between two chip module layers and between chip modules of the same layer.

FIG. 4 shows how the concept of the invention is applied to connect circuit boards along a principal axis and along a transverse direction. The construction of FIG. 4 includes a plurality of circuit boards 52 interconnected in the same manner as FIG. 1, and additional circuit boards 54 and 56 at right angles to the first boards 52. Button boards 58 are alternated between the circuit boards 54 and one button board is interposed between the circuit boards 54 and the edges of the boards 52. Likewise, button boards 60 are alternated between the circuit boards 56 and one is positioned between the boards 56 and the edges of the circuit boards 52. Buttons 64 form connector elements in the button boards.

As indicated by the arrows 65 and 66, compressive force is applied to the stack of boards 52 and to the stacks of boards 54 and 56. These compressive forces may be applied in any convenient manner, one example being shown in FIG. 5. A rigid housing 70 includes a fixed rear pressure plate 72 bearing on one face of a stack of boards to be compressed and a movable pressure plate 74 bearing on the opposite face of the same stack of boards. A reaction plate 76 is disposed between the movable pressure plate and an inside wall of the housing 70. A number of pressure screws 78 are threadably engaged in the reaction plate 76 and bear on the outer face of the movable pressure plate 74. Tightening the pressure screws 78 forces the movable pressure plate 74 away from the reaction plate 76, thereby applying a compressive force between the two pressure plates 72 and 74.

Another embodiment of the invention is shown in FIG. 6. A plurality of circuit boards 80 have components of substantial thickness mounted on them and are interconnected by means of button boards 82 and feed-through spacers 84. The spacers 84 are needed to space the circuit boards 80 apart sufficiently to provide clearance for the components mounted on the boards. The button boards 82 are positioned one on each side of each spacer 84. Buttons 86 establish appropriate connections between the circuit boards 80 and the spacers 84, which are insulated boards with conductive-through holes that establish electrical connections from one side of the spacers to the other. Both the spacers 84 and the button boards 82 are made with appropriate openings to clear the circuit boards components, and the entire assembly is clamped together with nuts 88 and bolts 90 extending through all of the circuit boards 80.

It will be appreciated from the foregoing that the present invention represents a significant advantage over packaging techniques of the prior art. In particular, the novel construction of the invention allows for the interconnection of multiple circuit elements, such as circuit boards and IC chip packages, without the use of cable harnesses or separate backpanel wiring techniques. The novel construction also needs no soldered connections and no multilayered circuit boards to effect the desired interconnections. Even more importantly, use of the invention results in substantial reduction in the circuit reactances of interconnection conduction paths, and a corresponding increase in the speed of operation of the circuitry.

It will also be appreciated that, although specific embodiments of the invention have been described in detail for purposes of illustration, various modifications may be made without departing from the spirit and scope of the invention. Accordingly, the invention is not to be limited except as by the appended claims.

I claim:

1. A packaging construction for electronic components, said construction comprising:
   a plurality of circuit packaging elements, each having a plurality of contact areas to which input and output signal leads are connected from within the circuit packaging element;
   a plurality of insulated boards disposed between adjacent pairs of said circuit packaging elements, each of said insulated boards having a plurality of openings through it, at least some of which are at positions corresponding to said contact areas;

a plurality of conductive connector elements disposed in selected ones of the openings in said insulated boards, each of said connector elements being a wadded strand of conductive wire that is deformed when compressed between contact areas and makes multiple electrical contacts between said contact areas; and means for applying a compressive force to said circuit packaging elements and said insulated boards, to compress said connector elements into electrical contact with the contact areas and thereby establish desired electrical connections between contact areas on said circuit packaging elements;

whereby interconnection path lengths between circuit packaging elements are substantially shortened, and input and output leads in said circuit packaging elements are not required to connect to edge connectors.

2. A packaging construction as set forth in claim 1, wherein:

said circuit packaging elements include printed circuit boards having components mounted thereon;

said construction further includes a plurality of feed-through spacer boards disposed between said circuit boards and having sufficient thickness to provide clearance for the circuit board components; and interconnection between circuit boards is made from one circuit board to one of said spacer boards, through a first set of said connector elements, and thence to an adjacent circuit board through a second set of said connector elements.

3. A packaging construction as set forth in claim 1, wherein:

said construction includes a plurality of two-sided printed circuit boards for use in establishing interconnection between said circuit packaging elements; and interconnection between said circuit packaging elements is established through a first set of said connector elements to connect from one circuit packaging element to a two-sided circuit board, and then through a second set of said connector elements to connect from the two-sided circuit board to a second of said circuit packaging elements and so forth through a selected number of layers, to effect a layer-replaceable multilayer board.

4. A packaging construction as set forth in claim 3, wherein:

said circuit packaging elements include printed circuit boards and integrated-circuit chip packages.

5. A packaging construction for electronic components, said construction comprising:

a plurality of circuit packaging elements, each having a plurality of contact areas to which input and output signal leads are connected from within the circuit packaging element;

a plurality of insulated boards disposed between adjacent pairs of said circuit packaging elements, each of said insulated boards having a plurality of openings through it, at least some of which are at positions corresponding to said contact areas;

a plurality of conductive connector elements disposed in selected ones of the openings in said insulated boards; and means for applying a compressive force to said circuit packaging elements and said insulated boards, to compress said connector elements into electrical contact with the contact areas and thereby establish desired electrical connections between contact areas on said circuit packaging elements;

whereby interconnection path lengths between circuit packaging elements are substantially shortened, and input and output leads in said circuit packaging elements are not required to connect to edge connectors;

and wherein said construction includes a plurality of two-sided printed circuit boards for use in establishing interconnection between said circuit packaging elements, interconnection between said circuit packaging elements is established through a first set of connector elements to connect from one circuit packaging element to a two-sided circuit board, and then through a second set of said connector elements to connect from the two-sided circuit board to a second of said circuit packaging elements, and so forth through a selected number of layers, to effect a layer-replaceable multilayer board;

some of said circuit packaging elements and said two-sided circuit boards include contact areas on their edges; and said construction further includes at least one additional set of connector elements and one insulated board for contacting some of said contact areas on the edges of said two-sided circuit boards and said circuit packaging elements, and at least one additional circuit packaging element oriented at right angles to the others, for connection to the edge contact areas.

6. A packaging construction as set forth in claim 5, wherein:

each of said connector elements is a wadded strand of conductive wire that is deformed when compressed between contact areas and makes multiple electrical contacts between said contact areas.

* * * * *